United States Patent

Yu et al.

[11] Patent Number: 6,013,570
[45] Date of Patent: Jan. 11, 2000

[54] LDD TRANSISTOR USING NOVEL GATE TRIM TECHNIQUE

[75] Inventors: Allen S. Yu, Fremont; Patrick K. Cheung, Sunnyvale; Paul J. Steffan, Elk Grove, all of Calif.

[73] Assignee: Advanced Micro Devices, Inc., Sunnyvale, Calif.

[21] Appl. No.: 09/118,389

[22] Filed: Jul. 17, 1998

[51] Int. Cl.$^7$ .................................... H01L 21/336
[52] U.S. Cl. ............................ 438/595; 438/182
[58] Field of Search ........................ 438/159, 163, 438/174, 194–196, 201, 202, 217, 230–232, 179, 182, 184, 301, 303, 585, 595, 574

[56] References Cited

U.S. PATENT DOCUMENTS

| | | | |
|---|---|---|---|
| 4,795,718 | 1/1989 | Beitman | 438/595 |
| 5,001,077 | 3/1991 | Sakai | 438/185 |
| 5,147,814 | 9/1992 | Takeuchi | 438/301 |
| 5,286,652 | 2/1994 | Wang et al. | 436/202 |
| 5,650,342 | 7/1997 | Satoh et al. | 437/36 |

*Primary Examiner*—Olik Chaudhuri
*Assistant Examiner*—Anh Duy Mai
*Attorney, Agent, or Firm*—Mikio Ishimaru

[57] ABSTRACT

An ultra-large scale MOS integrated circuit semiconductor device is processed after the formation of the gate oxide and polysilicon layer by forming a forming a first mask layer over the polysilicon layer followed by a second mask layer over the first mask layer. The first mask layer and the second mask layer are patterned to form first gate mask and second gate mask respectively. The polysilicon gate is then formed by anisotropically etching the polysilicon layer. The second gate mask is then removed. The polysilicon gate is then etched isotropically to reduce its width using the gate oxide layer and the patterned first gate mask as hard masks. The first gate mask is then used as a mask for dopant implantation to form source and drain extensions which are spaced away from the edges of the polysilicon gate. Thereafter, the first gate mask is removed and a spacer is formed dopant implantation to form deep source and drain junctions. A higher temperature rapid thermal anneal then optimizes the source and drain extension junctions and junctions, and the spacer is removed. Since the source and drain extension junctions are spaced away from the edges of the polysilicon gate, the displacement of the source/drain extension junctions into the channel is reduced. This results in a device with reduced parasitic capacitance.

4 Claims, 12 Drawing Sheets

LDD TRANSISTOR USING NOVEL GATE TRIM TECHNIQUE

TECHNICAL FIELD

The present invention relates generally to manufacturing semiconductors and more specifically to a manufacturing method for Metal-Oxide Semiconductors (MOS) which employ lightly doped drain (LDD) structures.

BACKGROUND ART

Metal-Oxide-Semiconductor (MOS) is the primary technology for ultra large-scale integrated (ULSI) circuits. To gain performance advantages, scaling down the size of MOS devices has been the principal focus of the microelectronics industry over the last two decades.

The conventional process of manufacturing MOS devices involves doping a silicon substrate and forming a gate oxide on the substrate followed by a deposition of polysilicon. A photolithographic process is used to etch the polysilicon to form the device gate. As device sizes are scaled down, the gate width, source junctions and drain junctions have to scale down. As the gate width reduces, the channel length between the source and drain is shortened. The shortening in channel length has led to several severe problems.

One of the problems associated with shortened channel length is the so-called "hot carrier effect". As the channel length is shortened, it causes a saturated condition that increases the maximum energy on the drain side of the MOS device. The high energy causes electrons in the channel region to become "hot". The electron generally becomes hot in the vicinity of the drain edge of the channel where the energy arises. Hot electrons can degrade device performance and cause breakdown of the device. Moreover, the hot electrons can overcome the potential energy barrier between the silicon substrate and the silicon dioxide layer overlying the substrate, which causes hot electrons to be injected into the gate oxide.

Problems arising from hot carrier injections into the gate oxide include generation of a gate current and generation of a positive trapped charge which can be permanently increase the threshold voltage of the MOS device. These problems are manifested as an undesirable decrease in saturation current, decrease of the transconductance, and a continual reduction in device performance caused by trapped charge accumulation. Thus, hot carrier effects cause unacceptable performance degradation in MOS devices built with conventional drain structures when channel lengths are short.

To try to remedy these problems, alternative drain structures such as lightly doped drain (LDD) structures have been developed. Lightly doped drain structures act as parasitic resistors and absorb some of the energy into the drain and thus reduce maximum energy in the channel region. This reduction in energy reduces the formation of hot electrons.

In most typical LDD structures, sources/drains are formed by two implants with dopants. One implant is self-aligned to the polysilicon gates to form shallow source/drain extension junctions or the lightly doped source/drain regions. Oxide or oxynitride spacers then would be formed around the polysilicon gate. With the shallow drain extension junctions protected by the spacers, a second implant with heavier dose is self-aligned to the oxide spacers around polysilicon gates to form deep source/drain junctions. There would then be a rapid thermal anneal (RTA) for the source/drain junctions to enhance the diffusion of the dopants implanted in the deep source/drain junctions so as to optimize the device performance. The purpose of the first implant is to form a LDD at the edge near the channel. In a LDD structure, almost the entire voltage drop occurs across the lightly doped drain region. The second implant with heavier dose forms low resistance deep drain junctions, which are coupled to the LDD structures. Since the second implant is spaced from the channel by the spacers, the resulting drain junction adjacent the light doped drain region can be made deeper without impacting device operation. The increase junction depth lowers the sheet resistance and the contact resistance of the drain.

Further improvements in transistor reliability and performances for exceeding smaller devices are achieved by a transistor having LDD structures only at the drain region (asymmetric LDD structures). Parasitic resistance due to the LDD structure at the source region of a transistor causes a decrease in drain current as well as a greater power dissipation for a constant supply voltage. The reduction in drain current is due to the effective gate voltage drop from self-biased negative feedback. At the drain region of the transistor, the drain region parasitic resistance does not appreciably affect drain current when the transistor is operating in the saturation region. Therefore, to achieve high-performance MOS transistor operation, it is known to form LDD structures only at the drain regions but not at the source regions.

While forming LDD structures only at the drain regions may improve transistor performance, it requires the use of an additional photolithographic masking process using implant masks to prevent ion implantation of the source regions (yet to be formed) during the first implant. The additional photolithographic process adversely increases cycle time and process complexity and also introduce particles and defects, resulting in an increase in cost and yield loss. Accordingly, forming LDD structures at both the source and drain regions remain to be the preferred alternative.

One significant problem with the LDD structures is the formation of parasitic capacitors. These parasitic capacitors are formed due to the diffusion of dopants from the LDD towards the channel regions underneath the polysilicon gates as a result of rapid thermal anneal and other heating processes in the manufacturing of the transistors. These parasitic capacitors are highly undesirable because they slow down the switching speed of the transistors. The adverse speed impact increases disproportionately with shortened channels. Basically, the parasitic capacitance due to LDD structures as a percentage of the total transistor capacitance is higher for sub-0.18 micron transistors than it is for a 0.18 micron transistor and even worse for a sub-0.13 transistor, making the adverse speed impact much more significant in smaller transistors.

As the push to ever-higher performance semiconductor devices continues, smaller gate width is the remedy of choice. Because the desired gate width is smaller than the smallest gate width current lithography light sources can provide, alternative methods have been developed to reduce the gate width. One such technique is trimming the polysilicon gate photoresist masks to smaller dimensions by using an anisotropic oxygen plasma process prior to the gate etch begins. Subsequently, the polysilicon gates are formed using a conventional etching process. The polysilicon gates thus formed replicate the dimensions of the trimmed photoresist masks, resulting in smaller gate widths. As explained above, however, the speed performance of these transistors is still impaired because of the significant increase in parasitic capacitance due to LDD structures The conventional approaches to reduce parasitic capacitance have been to reduce LDD implant dosage or scaling down the operating voltage. However, these approaches also degrade the performance of the transistors.

A method to reduce the parasitic capacitance due to LDD structures without compromising transistor performance has long been sought but has eluded those skilled in the art.

DISCLOSURE OF THE INVENTION

The present invention provides a method of manufacturing semiconductors having reduced parasitic capacitance.

The present invention further provides a method of manufacturing semiconductors having reduced polysilicon gate widths by using self-aligned isotropic etch.

The present invention still further provides a method of manufacturing semiconductors having LDD structures spaced away from the edge of polysilicon gates by using the self-aligned masks left from previous process step.

The present invention also provides a method of manufacturing semiconductors with LDD structures having reduced parasitic capacitance.

The present invention also provides a method of manufacturing semiconductor having one LDD structure per transistor, where each LDD structure has reduced parasitic capacitance.

The present invention additionally provides a method of manufacturing semiconductors using a single step ion implantation to form both LDD structures and the deep source/drain regions.

The above and additional advantages of the present invention will become apparent to those skilled in the art from a reading of the following detailed description when taken in conjunction with the accompanying drawings.

BRIEF DESCRIPTION OF THE DRAWINGS

FIGS. 2A through 2I illustrate the sequence of process steps of a conventional LDD process with a conventional gate mask trimming technique for fabricating an MOS transistor with LDD structures in the source and drain regions;

BEST MODE FOR CARRYING OUT THE INVENTION

FIGS. 1A through 1H illustrate a conventional LDD process for fabricating an MOS transistor with LDD structures in the source and drain regions.

Figure 1A:
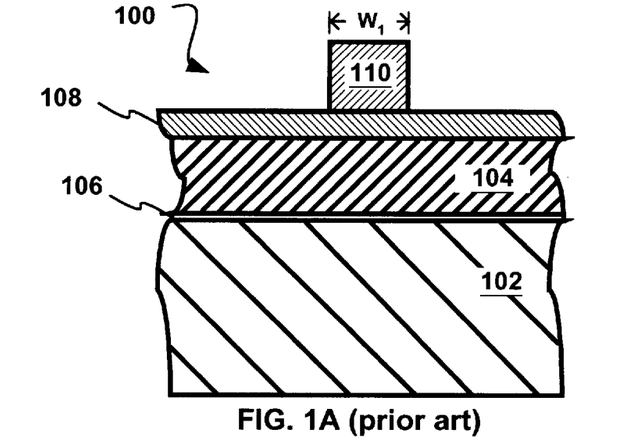
FIGS. 1A through 1H illustrate the sequence of process steps of a conventional LDD process for fabricating an MOS transistor with LDD structures in the source and drain regions.

Referring now to FIG. 1A, therein is shown a cross-section of a semiconductor 100 in an intermediate stage of processing. At this stage are shown a silicon substrate 102 with a polysilicon layer 104 and a layer of gate oxide 106 disposed between the silicon substrate 102 and the polysilicon layer 104. On top of the polysilicon layer is a first mask layer 108. The first mask layer 108 is typically an anti-reflective coating (ARC) for enhancing the imaging effect in subsequent photolithography processing. The materials that have been used for ARC have included various oxides and nitrides. One of the most commonly used ARC is silicon oxynitride (SiON). On top of the ARC 108 is a patterned second mask (gate mask) 110 which is typically a photoresist material. The gate mask 110 has a width of $W_1$.

Figure 1B:
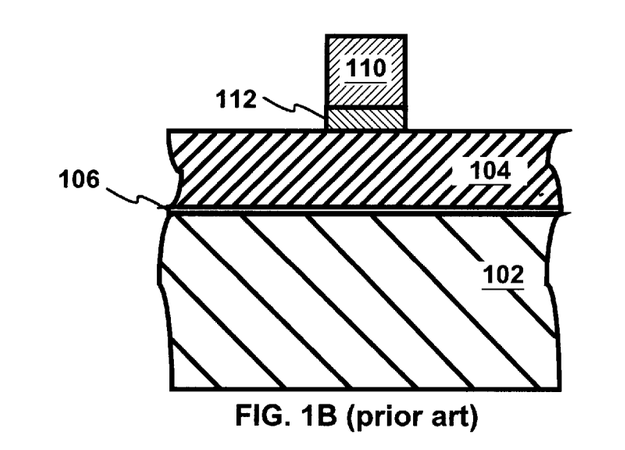

Referring now to FIG. 1B, therein is shown the silicon substrate 102 after the conventional step of ARC etch to form a patterned ARC mask 112.

Figure 1C:
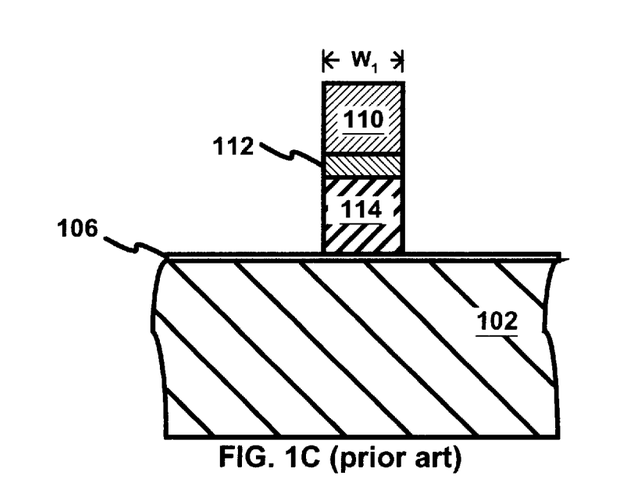

Referring now to FIG. 1C, therein is shown the silicon substrate 102 after the conventional step of polysilicon gate etch which forms the polysilicon gate 114. The polysilicon gate has a width of $W_1$ because it replicates the dimension of the gate mask 110.

Figure 1D:
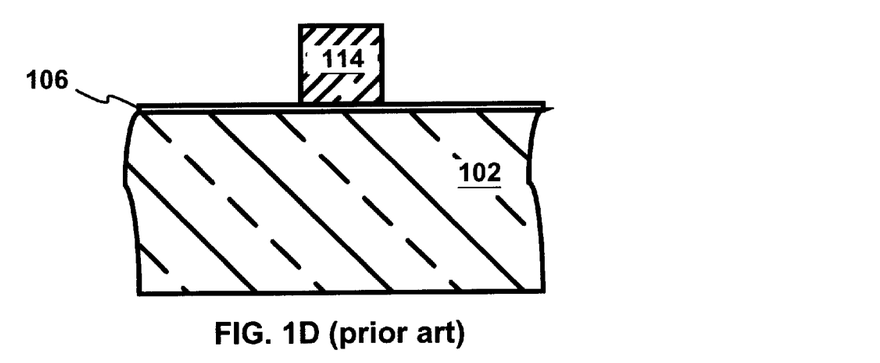

Referring now to FIG. 1D, therein is shown the silicon substrate 102 after the conventional steps of photoresist striping and ARC removal.

Figure 1E:
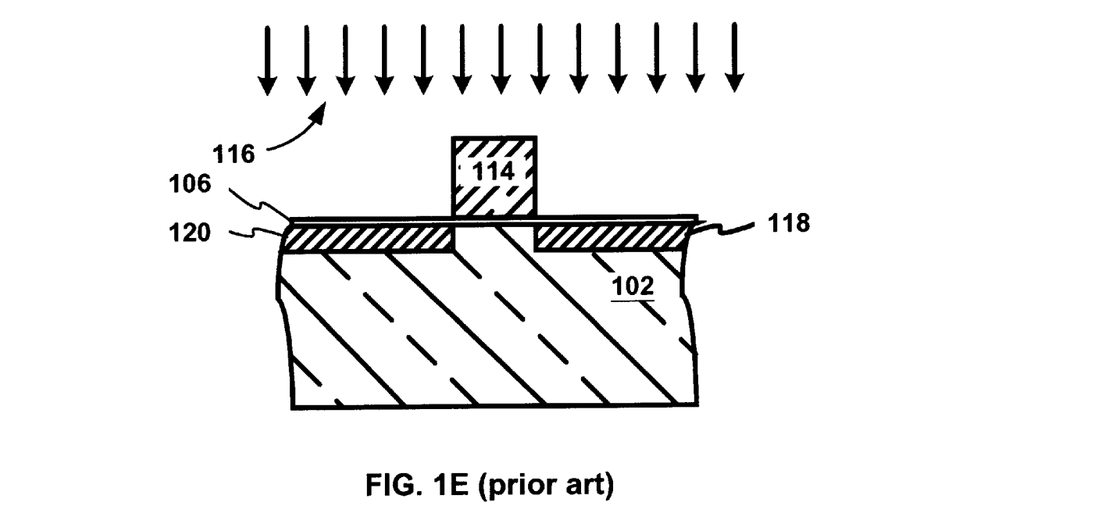

Referring now to FIG. 1E, therein is shown the ion implantation 116 of a dopant through the thin gate oxide 106 to form the doped regions of a source and a drain extension junctions 118 and 120. It should be noted that "source" and "drain" may be used interchangeably since they are the same for all purposes until connected in a circuit.

Figure 1F:
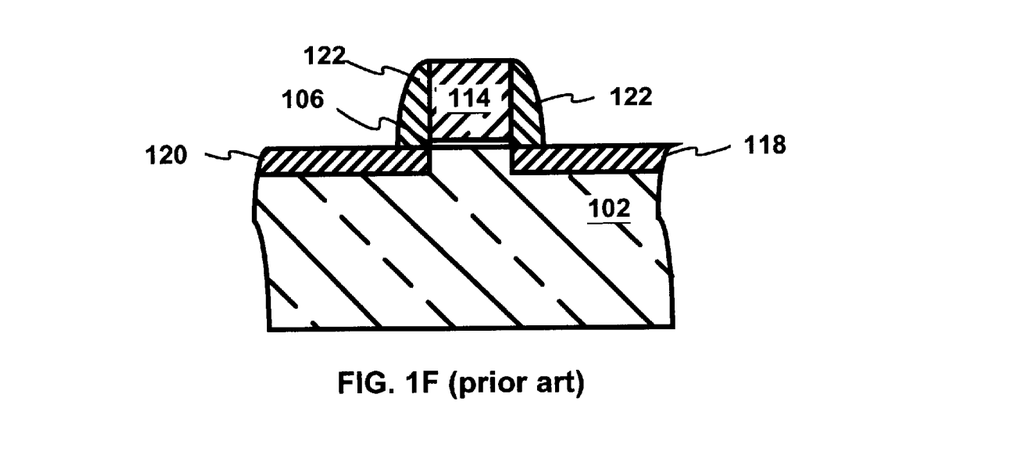

Referring now to FIG. 1F, therein is shown a sidewall spacer 122 formed around the polysilicon gate 114. At this stage, except for the gate oxide 106 located directly underneath the polysilicon gate 114, gate oxide on other areas of the substrate 102 have been removed.

Figure 1G:
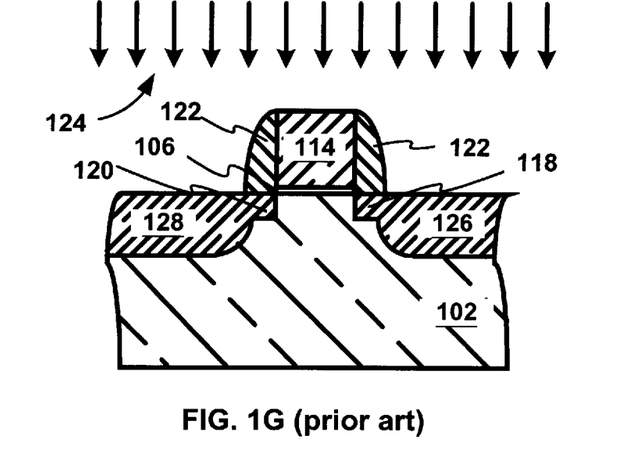

Referring now to FIG. 1G, therein is shown the ion implantation 124 of a dopant through a conventionally formed sidewall spacer 122 to form doped, deep source and drain junctions 126 and 128. The sidewall spacer 122 shields the shallow source and drain extension junction 118 and 120 from ion implantation 124.

For PMOS devices, junction and extension junction dopants are Group II elements such as boron, aluminum, and gallium are used, with boron (B) or boron difluoride ($BF_2$) being the most commonly used.

For NMOS devices, Group V elements are used as junction and extension junction dopants.

Figure 1H:
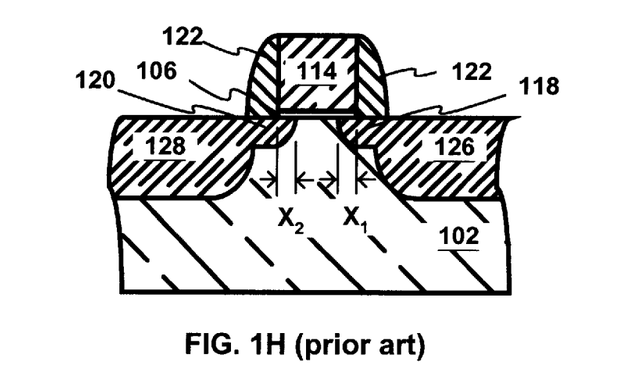

Referring now to FIG. 1H, therein is shown the rapid thermal anneal (RTA) of the doped, shallow source and drain extension junctions 118 and 120, and deep source and drain junctions 126 and 128. The transient enhanced diffusion caused by the RTA inherently increases the displacement of the shallow source and drain extension junctions 118 and 120 into the channel region. The shallow source and drain extension junctions 118 and 120 provide the resistance needed to suppress hot electrons. However, the overlap portions ($X_1$) between the shallow source junction extension 118, the gate oxide 106, and the polysilicon gate 114 form a parasitic capacitor 130. Similarly, the overlap portions ($X_2$) between the shallow drain junction extension 120, the gate oxide 106, and the polysilicon gate 114 form a parasitic capacitor 132. The more the overlap, the higher is the capacitance of the parasitic capacitor 130 and 132. As explained in the Background Art, parasitic capacitors are highly undesirable because they slow down the switching speed of the transistor. The adverse speed impact increases disproportionately with shortened channels. Thus it is desirable to reduce the overlap portions $X_1$ and $X_2$.

FIGS. 1I through 1L illustrate a conventional LDD process for fabricating an MOS transistor with a single LDD structure. For convenience of illustration, like reference numerals are used in FIGS. 1I through 1L to denote like elements already described in FIGS. 1A through 1H.

Figure 1I:
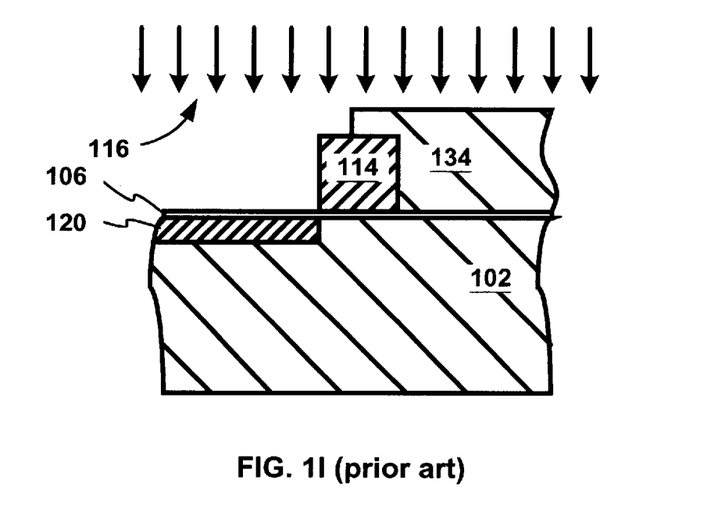
FIGS. 1I through 1L illustrate the sequence of process steps of a conventional LDD process that when used in combination with the steps of FIGS. 1A through 1D, form an MOS transistor with a single LDD structure.

Referring now to FIG. 1I, therein is shown the silicon substrate 102 after it had been processed through the identical steps as illustrated in FIGS. 1A through 1D. At this stage is shown ion implantation 116 of the dopant through the thin gate oxide 106 to form the doped, shallow drain extension junction 120. A conventional photolithographic masking process using an implant mask 134 is used to prevent ion implantation 116 of the source region (not shown) yet to be formed, and is then removed. The implant mask 116 is generally a photoresist material.

Figure 1J:
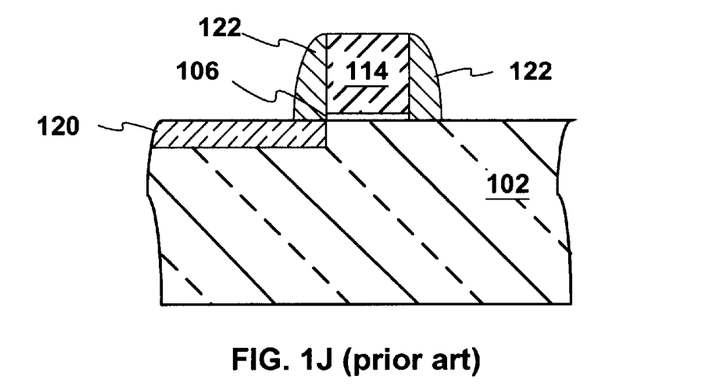

Referring now to FIG. 1J, therein is shown the sidewall spacer 122 formed around the polysilicon gate 114 similar to what was shown in FIG. 1F.

Figure 1K:
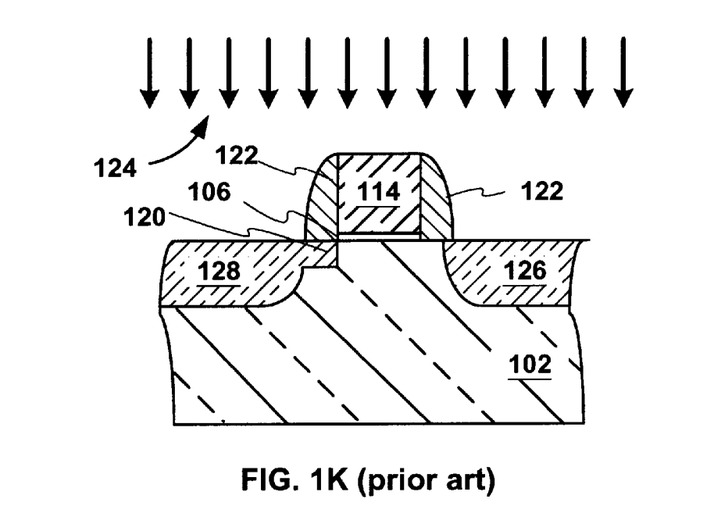

Referring now to FIG. 1K, therein is shown the ion implantation 124 of the dopant through the sidewall spacer 122 to form doped, deep source and drain junctions 126 and 128. The sidewall spacer 122 shields the shallow drain extension junction 120 from ion implantation 124.

Figure 1L:
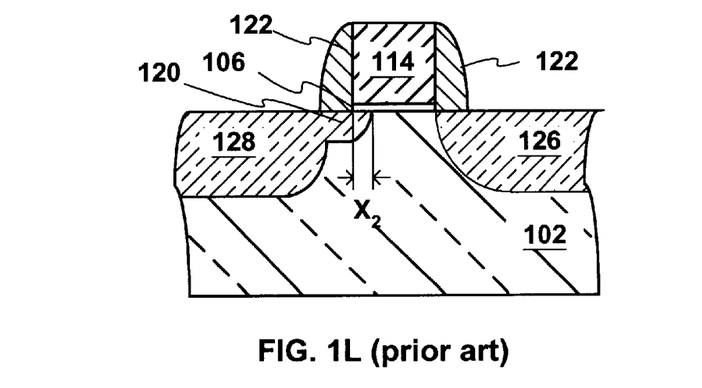

Referring now to FIG. 1L, therein is shown the RTA of the doped, shallow drain extension junction 120, and deep source and drain junctions 126 and 128. Again, the transient enhanced diffusion caused by the RTA inherently increases the displacement of the shallow drain extension junction 120 into the channel region. Similarly, the overlap portions ($X_2$) between the shallow drain junction extension 120, the gate oxide 106, and the polysilicon gate 114 form a parasitic capacitor 132. As explained in the Background AM, parasitic capacitors are highly undesirable because they slow down the switching speed of the transistor.

FIGS. 2A through 2H depict the process steps of a conventional LDD process using a conventional gate mask trimming technique for fabricating an MOS transistor with LDD structures in the source and drain regions.

Figure 2A:
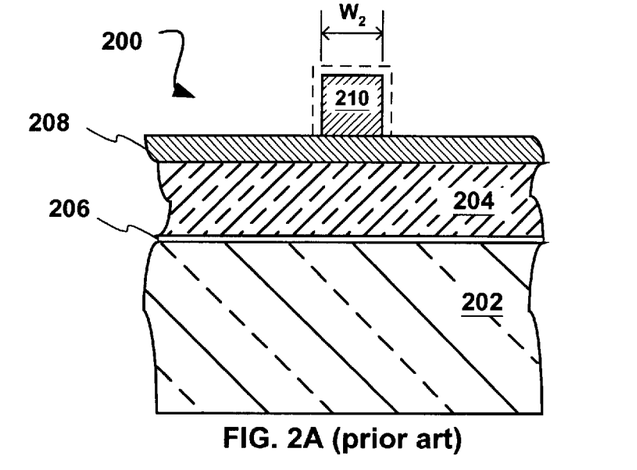

Referring now to FIG. 2A, therein is shown a cross-section of a semiconductor 200 in an intermediate stage of processing similar to what was shown in FIG. 1A. At this stage are shown a silicon substrate 202 with a layer of polysilicon layer 204 and a layer of gate oxide 206 disposed between the silicon substrate 202 and the polysilicon layer 204. On top of the polysilicon layer is a first mask layer 208. The first mask layer 208 is an ARC coating. On top of the ARC 208 is a patterned second mask (gate mask) 210 which is generally a photoresist material. The gate mask 210 has a width of $W_2$ which is smaller than the width $W_1$ of gate mask 110 as shown in FIG. 1A. This is achieved by using a conventional gate mask trimming technique, such as an isotropic etching. Gate mask trimming is done to provide polysilicon gates that have gate widths smaller than what is possible with the current photolithographic technology alone. For example, the current photolithographic technology can provide a polysilicon gate with a width of down to about 260 nm. With the use of gate mask trimming technique, the resulting polysilicon gate can have a width of down to about 180 nm. A transistor with narrower gate width is highly desirable because it has a higher switching speed.

Figure 2B:
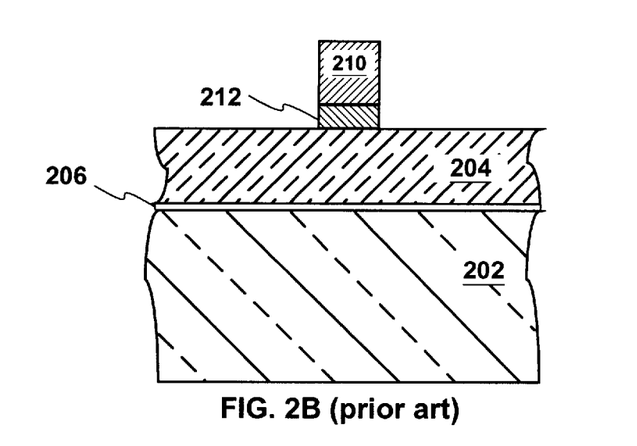

Referring now to FIG. 2B, therein is shown the silicon substrate 202 after the conventional step of ARC etch to form a patterned ARC mask 212.

Figure 2C:
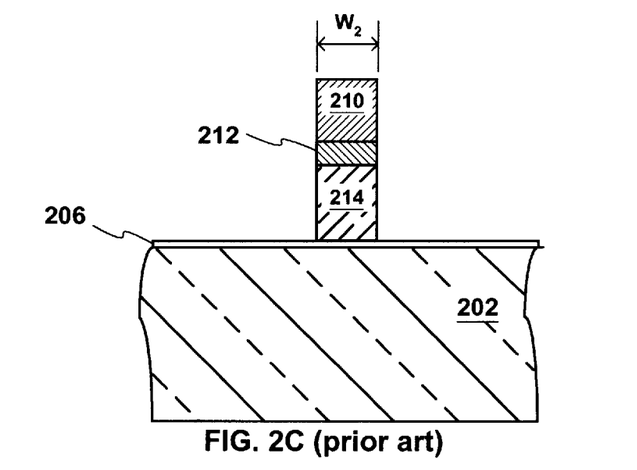

Referring now to FIG. 2C, therein is shown the silicon substrate 202 after the conventional step of polysilicon gate etch which forms the polysilicon gate 214. The polysilicon gate 214 has a width of $W_2$ because it replicates the dimension of the gate mask 210.

Figure 2D:
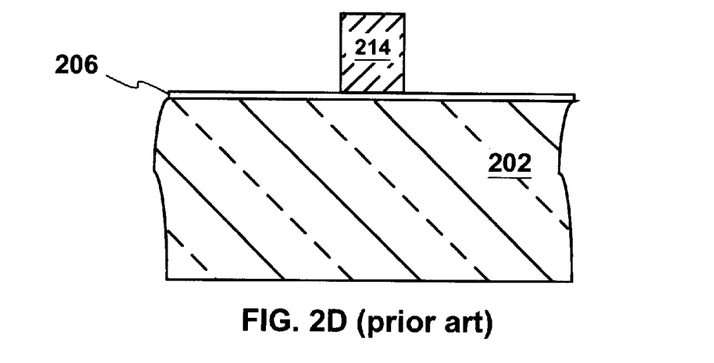

Referring now to FIG. 2D, therein is shown the silicon substrate 202 after the conventional steps of photoresist striping and ARC removal.

Figure 2E:
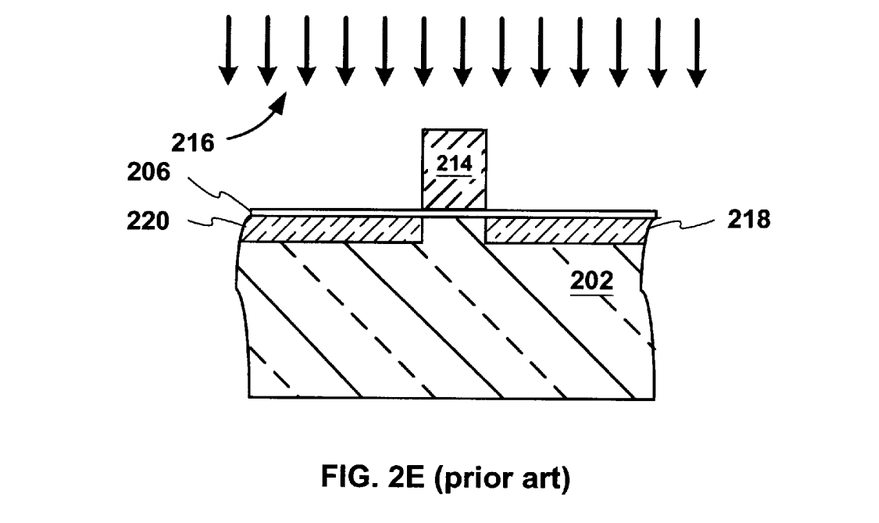

Referring now to FIG. 2E, therein is shown the ion implantation 216 of a dopant through the thin gate oxide 206 to form the doped regions of a source and a drain extension junctions 218 and 220.

Figure 2F:
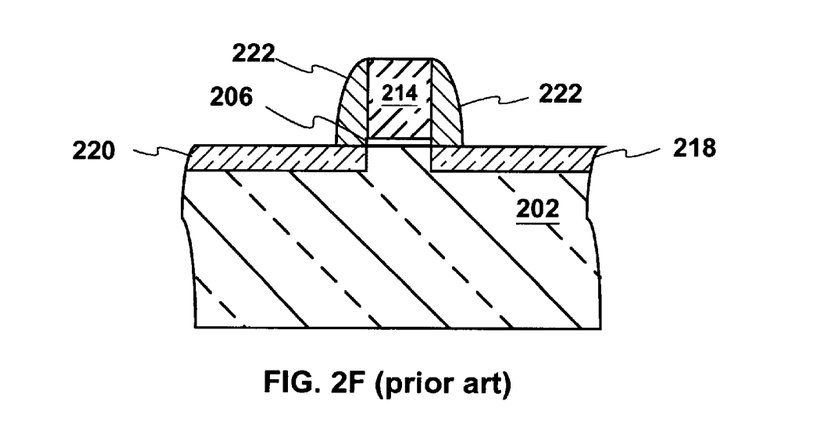

Referring now to FIG. 2F, therein is shown a sidewall spacer 222 formed around the polysilicon gate 214.

Figure 2G:
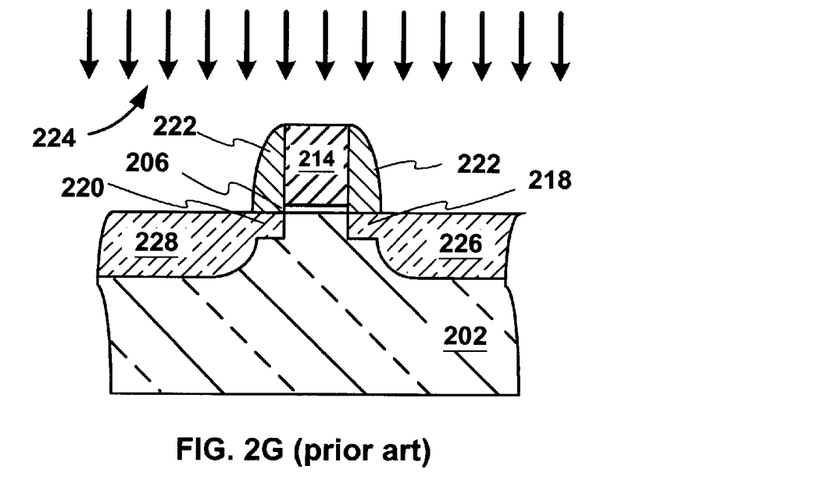

Referring now to FIG. 2G, therein is shown the ion implantation 224 of a dopant through the sidewall spacer 222 to form doped, deep source and drain junctions 226 and 228. The sidewall spacer 222 shields the shallow source and drain extension junction 218 and 120 from ion implantation 224.

Figure 2H:
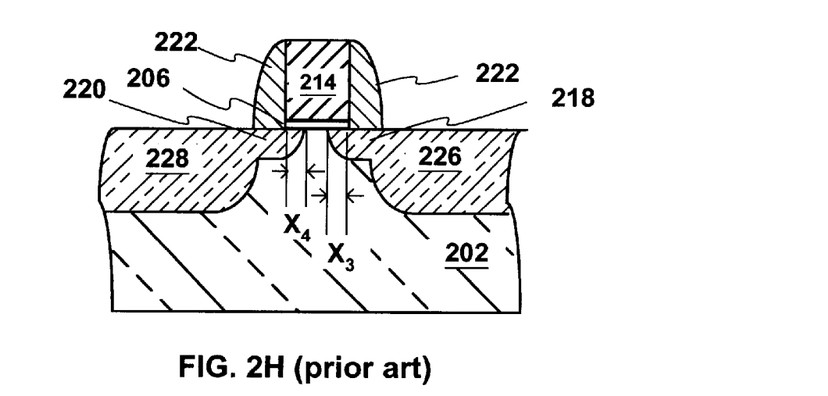

Referring now to FIG. 2H, therein is shown the RTA of the doped, shallow source and drain extension junctions 218 and 220, and deep source and drain junctions 226 and 228. Again, the transient enhanced diffusion caused by the RTA inherently increases the displacement of the shallow source and drain extension junctions 218 and 220 into the channel region. As explained earlier, the shallow source and drain extension junctions 218 and 220 provide the resistance needed to suppress hot electrons. However, the overlap portions ($X_3$) between the shallow source junction extension 218, the gate oxide 206, and the polysilicon gate 214 form a parasitic capacitor. Further, the overlap portions ($X_4$) between the shallow drain junction extension 220, the gate oxide 206, and the polysilicon gate 214 form another parasitic capacitor. Overlap portions $X_3$, $X_4$ in FIG. 2H and $X_1$, $X_2$ in FIG. 1H are approximately equal. However, the ratio of $X_3$ (or $X_4$) to $W_2$ (FIG. 2H) is much higher than the ratio of $X_1$ (or $X_2$) to $W_1$ (FIG. 1H) because $W_2$ is much smaller than $W_1$. Thus the parasitic capacitance due to the overlap portions $X_3$ or $X_4$ as a percentage of the total transistor capacitance becomes much more significant when the gate width reduces. Accordingly, the parasitic capacitance due to overlap portions $X_3$ and $X_4$ has a more significant impact to the overall capacitance of the transistor which results in a more severe speed penalty. Therefore, while gate mask trimming technique provides a transistor with further reduction in polysilicon gate width, the parasitic capacitance becomes increasingly worse. The same problem is found in MOS transistors with a single LDD structure using a conventional LDD process with a conventional gate mask trimming technique. The present invention addresses this parasitic capacitance problem.

FIG. 3A through 3H depict the LDD process in accordance with the present invention for fabricating an MOS transistor with LDD structures in the source and drain regions.

Figure 3A:
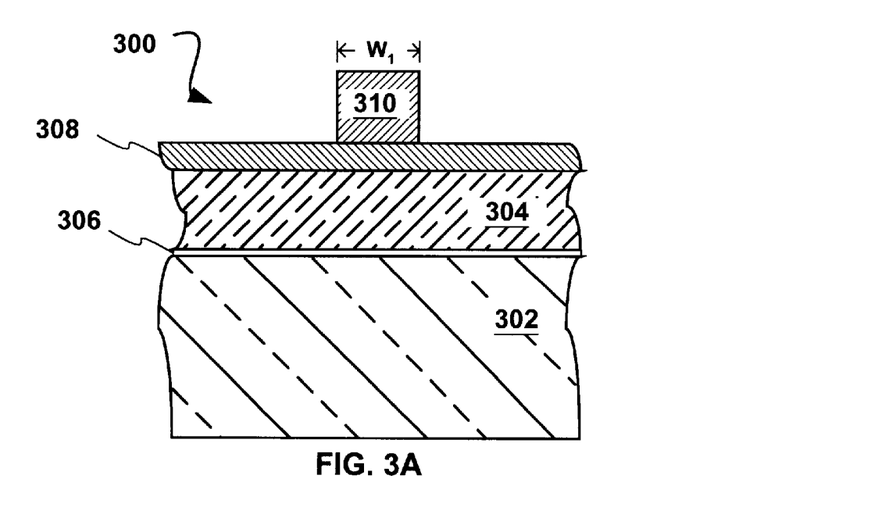
FIGS. 3A through 3H illustrate the sequence of process steps of a LDD process in accordance with the present invention for fabricating an MOS transistor with LDD structures in the source and drain regions.

Referring now to FIG. 3A, therein is shown a cross-section of a semiconductor 300 in an intermediate stage of processing. At this stage are shown a silicon substrate 302 with a layer of polysilicon layer 304 and a layer of gate oxide 306 disposed between the silicon substrate 302 and the polysilicon layer 304. On top of the polysilicon layer is an ARC layer 308. On top of the ARC 308 is a gate mask 310. The gate mask 310 has a width of $W_1$.

Figure 3B:
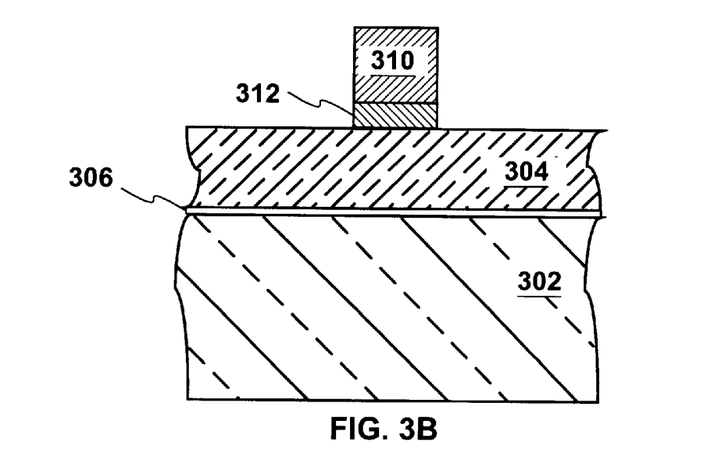

Referring now to FIG. 3B, therein is shown the silicon substrate 302 after the conventional step of ARC etch to form a patterned ARC mask 312.

Figure 3C:
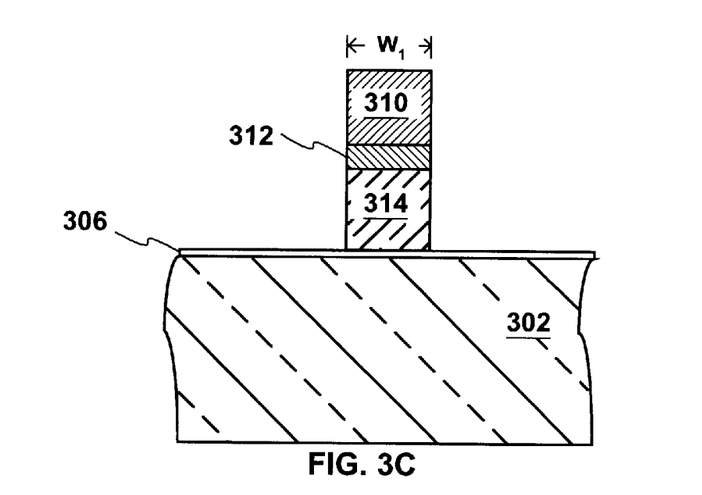

Referring now to FIG. 3C, therein is shown the silicon substrate 302 after the conventional step of polysilicon gate etch which forms the polysilicon gate 314. Again, the polysilicon gate has a width of $W_1$ because it replicates the dimension of the gate mask 310.

Figure 3D:
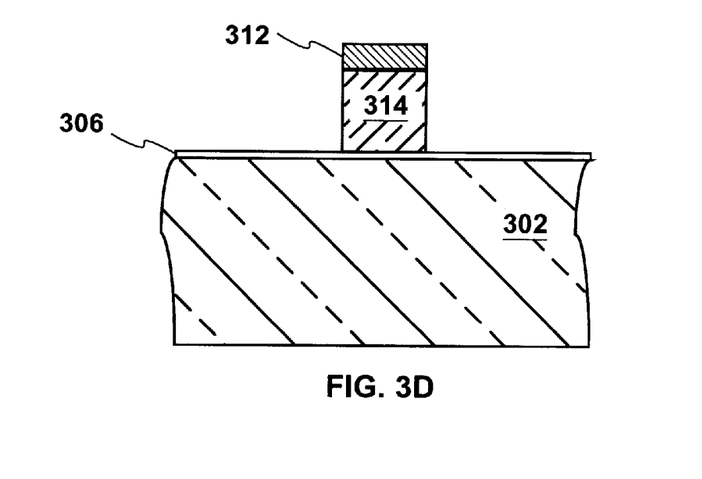

Referring now to FIG. 3D, therein is shown the silicon substrate 302 after the conventional steps of photoresist striping which remove the gate mask 310.

Figure 3E:
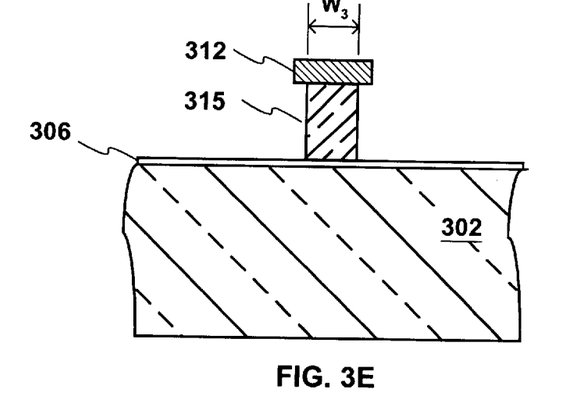

Referring now to FIG. 3E, therein is shown the silicon substrate 302 after the step of isotropic etching to form polysilicon gate 315 having a reduced width ($W_3$) in accordance with the present invention. The gate oxide 306 and ARC mask 312 serves as a self-aligned hard mask to force the isotropic etching to etch only in the lateral direction, reducing the width of the polysilicon gate 315. The isotropic etch process reduces the width of the polysilicon gate 314 by Y on each side, where $Y=\frac{1}{2} * (W_1 - W_3)$. Any conventional isotropic etching process can be used to etch the polysilicon gate 315.

Figure 3F:
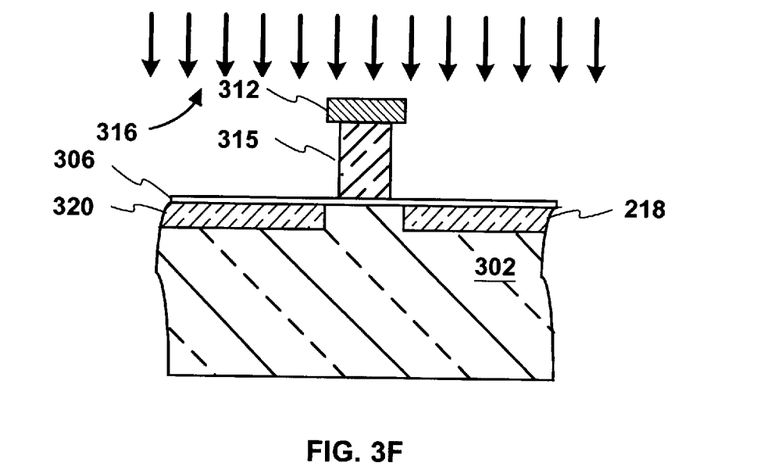

Referring now to FIG. 3F, therein is shown the ion implantation 316 of a dopant through the thin gate oxide 306 to form the doped regions of a source and a drain extension junctions 318 and 320. The ARC mask 312 functions as a mask to space the ion implantation 316 away from the edges of the polysilicon gate 315. Thus the shallow source/drain extension junctions 318 and 320 is each at a distance of Y away from the edges of the polysilicon gate 315.

Figure 3G:
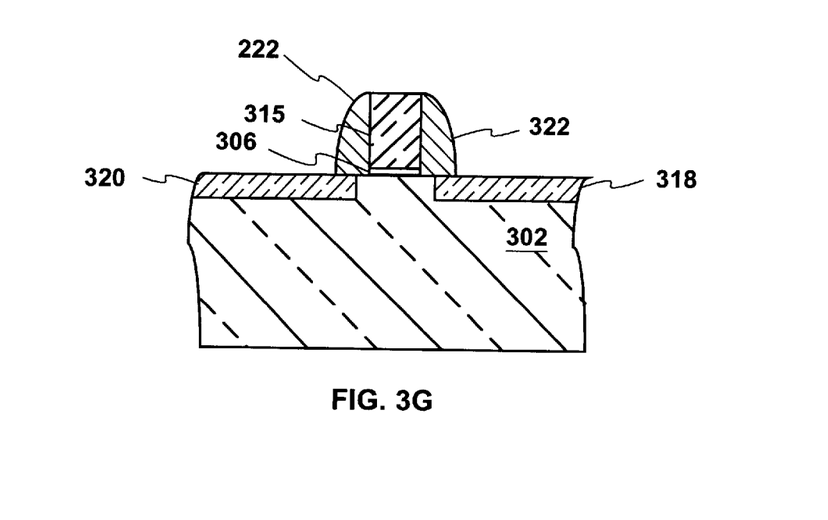

Referring now to FIG. 3G, therein is shown a sidewall spacer 322 formed around the polysilicon gate 314 after the ARC mask 312 is removed.

Figure 3H:
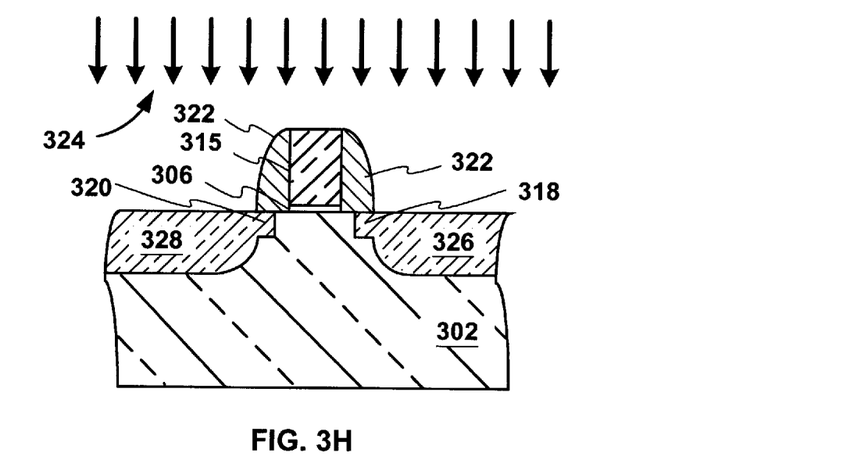

Referring now to FIG. 3H, therein is shown the ion implantation 324 of a dopant through the sidewall spacer 322 to form doped, deep source and drain junctions 326 and 328. The sidewall spacer 322 shields the shallow source and drain extension junction 318 and 320 from ion implantation 324.

Figure 3I:
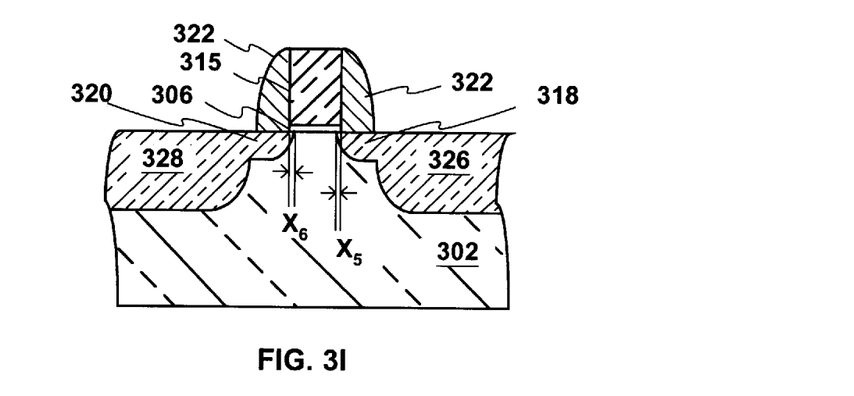
FIGS. 3J through 3M illustrate the sequence of process steps of a LDD process in accordance with the present invention that when used in combination with the steps of FIGS. 3A through 3E, form an MOS transistor with a single LDD structure.

Referring now to FIG. 3I, therein is shown the RTA of the doped, shallow source and drain extension junctions 318 and 320, and deep source and drain junctions 326 and 328. The shallow source and drain extension junctions 318 and 320 provide the resistance needed to suppress hot electrons. Again, the transient enhanced diffusion caused by the RTA inherently increases the displacement of the shallow source and drain extension junctions 318 and 320 into the channel region. Similarly, the overlap portions ($X_5$ and $X_6$) between the shallow source/drain extension junctions 318 and 320, the gate oxide 306, and the polysilicon gate 314 form parasitic capacitors. However, unlike the conventional LDD process, the overlap portions $X_5$ and $X_6$ are reduced since the shallow source/drain extension junctions 318 and 320 are spaced away from the edge of polysilicon gate 315 by a distance of Y prior to the RTA. Accordingly, the resultant parasitic capacitances are reduced. Furthermore, with the present invention, the width $W_3$ of the polysilicon gate 315 can be made equal to $W_2$ as depicted in FIG. 2C and still provide a ratio of $X_5$ (or $X_6$) to $W_3$ (FIG. 3I) which is much smaller than the ratio of $X_3$ (or $X_4$) to $W_2$ (FIG. 2H) because $X_5$ (or $X_6$) is much smaller than $X_3$ (or $X_4$). With the present invention, the parasitic capacitance due to the overlap portions $X_5$ or $X_6$ as a percentage of the total transistor capacitance does not increase significantly even when the gate width reduces. Accordingly, the parasitic capacitance problems associated with the conventional LDD process and gate mask trimming technique are overcome by the present invention.

FIGS. 3J through 3M illustrate a LDD process in accordance with the present invention for fabricating an MOS transistor with a single LDD structure. For convenience of illustration, like reference numerals are used in FIGS. 3J through 3M to denote like elements already described in FIG. 3A through 3I.

Figure 3J:
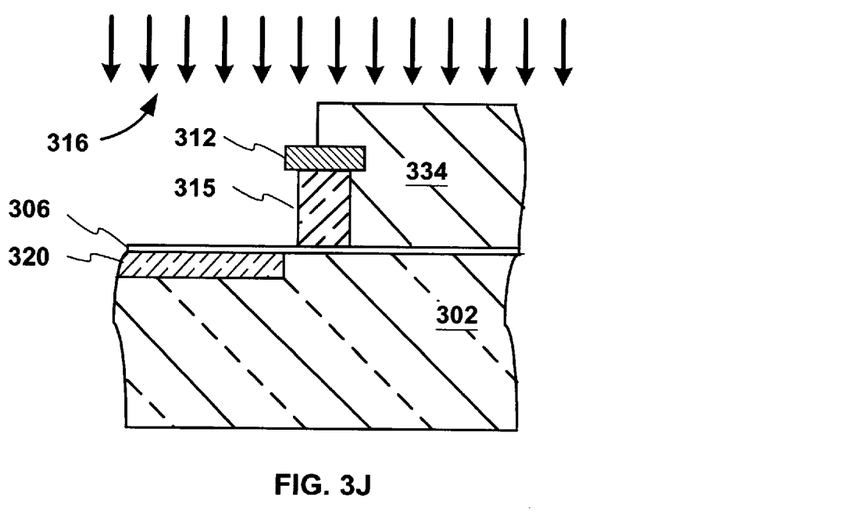

Referring now to FIG. 3J, therein is shown the silicon substrate 302 after it had been processed through the identical steps as illustrated in FIGS. 3A through 3E. At this stage is shown ion implantation 316 of the dopant through the thin gate oxide 306 to form the doped, shallow drain extension junction 320. A conventional photolithographic masking process using an implant mask 334 is used to prevent ion implantation 316 of the source region (not shown) yet to be formed, and is then removed. The implant mask 334 is generally a photoresist material.

Figure 3K:
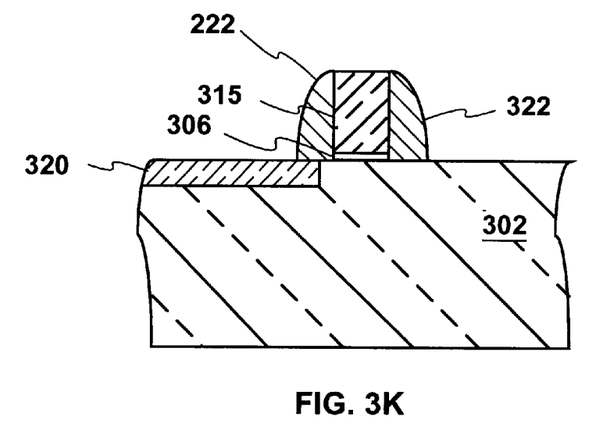

Referring now to FIG. 3K, therein is shown the sidewall spacer 322 formed around the polysilicon gate 314 after the ARC mask 312 is removed, similar to what was shown in FIG. 3F.

Figure 3L:
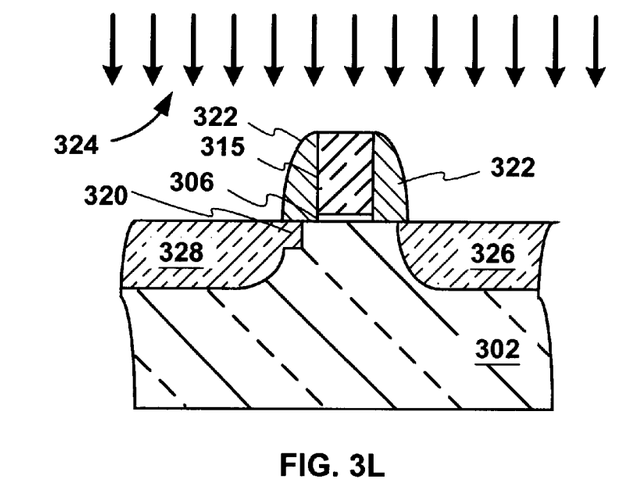

Referring now to FIG. 3L, therein is shown the ion implantation 324 of the dopant through the sidewall spacer 322 to form doped, deep source and drain junctions 326 and 328. The sidewall spacer 322 shields the shallow drain extension junction 320 from ion implantation 324.

Figure 3M:
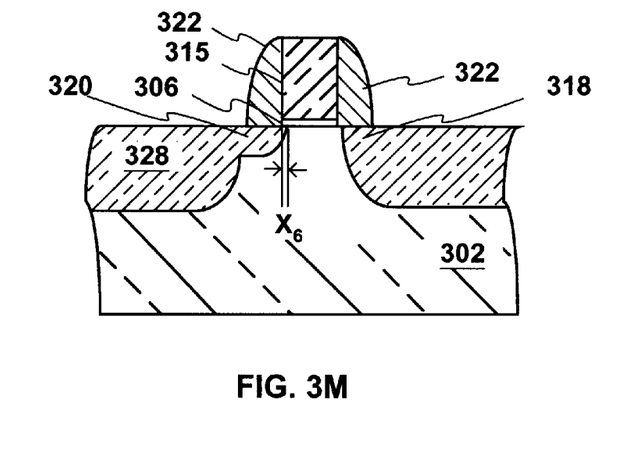

Referring now to FIG. 3M, therein is shown the RTA of the doped, shallow drain extension junction 320, and deep source and drain junctions 326 and 328. Similar to what was described earlier with respect to FIG. 3I, the overlap portions $X_6$ between the shallow drain extension junction 320, the gate oxide 306, and the polysilicon gate 315 form a parasitic capacitor. Again, unlike the conventional LDD process, the overlap portions $X_6$ are reduced since the shallow source/drain extension junction 320 is spaced away from the edge of polysilicon gate 315 by a distance of Y prior to the RTA. Accordingly, the resultant parasitic capacitance is reduced and so is the ratio of $X_6$ to $W_3$. Accordingly, the parasitic capacitance problems associated with the conventional LDD process and gate mask trimming technique are overcome by the present invention.

Figure 4:
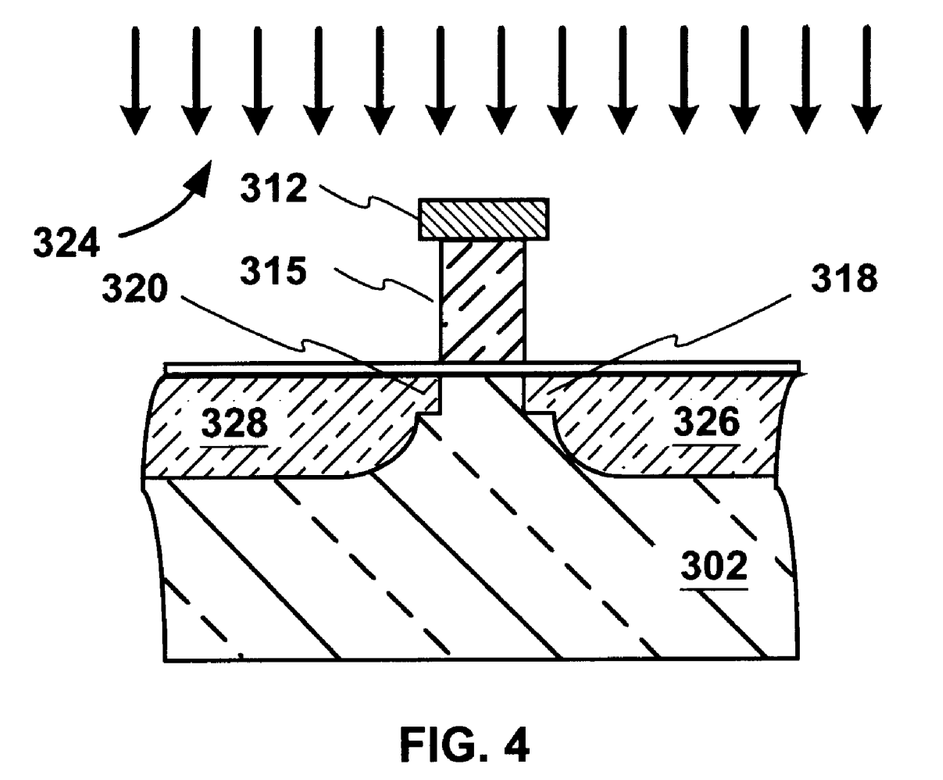
FIG. 4 illustrates the process step of a LDD process in accordance with the present invention that when used in combination with the steps of FIGS. 3A through 3E form an MOS transistor with LDD structures in the source and drain regions.

FIG. 4 illustrates a process in accordance with the present invention for fabricating an MOS transistor with LDD structures in the source and drain regions. For convenience of illustration, like reference numerals are used in FIG. 4 to denote like elements already described in FIGS. 3A through 3I.

Referring now to FIG. 4, therein is shown the silicon substrate 302 after it had been processed through the identical steps as illustrated in FIGS. 3A through 3E. At this stage is shown ion implantation 324 of the dopant through the thin gate oxide. By adjusting the dosage and strength of the ion implantation 324 and the thickness of the ARC mask 312, shallow source/drain extension junctions 318 and 320 and deep source/drain junctions 326 and 328 may be formed with a single ion implantation step. In this case, the portions of the ARC mask 312 that overhang the polysilicon gate 315 function as an implant mask to reduce the amount of ion reaching the silicon substrate, thus forming the shallow source/drain extension junctions 318 and 320. The elimination of an ion implantation step and its associated steps, such as the forming and removal of sidewall spacers) is very desirable because it significantly reduces cost and yield losses as well as cycle time and process complexity.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A method for manufacturing a semiconductor on a semiconductor substrate, comprising the steps of:

forming a gate oxide layer over the semiconductor substrate;

forming a polysilicon layer over said gate oxide layer;

forming a first mask layer over said polysilicon layer;

forming a second mask layer over said first mask layer;

patterning said second mask layer to form second gate masks;

patterning said first mask layer to form first gate masks after the step of patterning said second mask layer to form second gate masks;

anisotropically etching said polysilicon layer to form polysilicon gates;

removing said second gate masks;

isotropically etching said polysilicon gates prior to the step of removing said first gate masks;

implanting shallow extension junctions with a dopant after the step of isotropically etching said polysilicon gates;

removing said first gate masks;

forming sidewall spacers around said polysilicon gates after the step of removing said first gate masks; and implanting deep junctions with said dopant.

2. The method as claimed in claim 1 wherein the step of isotropically etching said polysilicon gates results in the removal of portions of said polysilicon gates in a lateral direction by a predetermined amount.

3. The method as claimed in claim 1 wherein said first mask layer is a material selected from the group consisting of oxide and nitride.

4. The method as claimed in claim 1 wherein said first mask layer is silicon oxynitride.

* * * * *